(12) United States Patent
Ko et al.

(10) Patent No.: US 10,636,649 B2
(45) Date of Patent: Apr. 28, 2020

(54) METHOD AND APPARATUS FOR FORMING SILICON OXIDE FILM ON TUNGSTEN FILM

(71) Applicant: TOKYO ELECTRON LIMITED, Tokyo (JP)

(72) Inventors: Kyungseok Ko, Gyeonggi-do (KR); Koji Sasaki, Yamanashi (JP); Toshiyuki Ikeuchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/048,493

(22) Filed: Jul. 30, 2018

(65) Prior Publication Data

US 2019/0043712 A1 Feb. 7, 2019

(30) Foreign Application Priority Data

Aug. 2, 2017 (JP) .................... 2017-149959

(51) Int. Cl.
*H01L 21/02* (2006.01)
*C23C 16/40* (2006.01)
(Continued)

(52) U.S. Cl.
CPC .... *H01L 21/02211* (2013.01); *C23C 16/0272* (2013.01); *C23C 16/402* (2013.01); *C23C 16/45502* (2013.01); *C23C 16/45529* (2013.01); *H01L 21/022* (2013.01); *H01L 21/0228* (2013.01); *H01L 21/02164* (2013.01); *H01L 21/02219* (2013.01); *H01L 21/02274* (2013.01); *H01L 21/02304* (2013.01); *H01L 27/11575* (2013.01); *H01L 27/11582* (2013.01); *H01L 21/76834* (2013.01); *H01L 2221/1073* (2013.01)

(58) Field of Classification Search
CPC ................................................ H01L 21/02211
See application file for complete search history.

(56) References Cited

U.S. PATENT DOCUMENTS

| 2005/0142742 | A1* | 6/2005 | Tonomura ......... H01L 21/02178 438/257 |
| 2015/0194441 | A1* | 7/2015 | Yatsuda ............ H01L 27/11582 438/587 |

(Continued)

FOREIGN PATENT DOCUMENTS

JP 2016171280 A 9/2016

*Primary Examiner* — Peniel M Gumedzoe
*Assistant Examiner* — Christopher A Johnson
(74) *Attorney, Agent, or Firm* — Nath, Goldberg & Meyer; Jerald L. Meyer

(57) ABSTRACT

A method for forming a silicon oxide film on a tungsten film includes performing a first process of arranging an object to be processed in a processing container kept under a reduced pressure, the object including a tungsten film and a natural oxide film being formed on a surface of the tungsten film, performing a second process of forming a silicon seed layer by adsorbing a silicon-containing gas to the tungsten film, subsequently performing a third process of annealing the object and forming the silicon oxide film by a reaction of the natural oxide film and the silicon seed layer and subsequently performing a fourth process of forming an ALD silicon oxide film by ALD using a silicon-containing gas and an oxygen active species.

11 Claims, 12 Drawing Sheets

(51) Int. Cl.
*C23C 16/455* (2006.01)
*H01L 27/11575* (2017.01)
*H01L 27/11582* (2017.01)
*C23C 16/02* (2006.01)
*H01L 21/768* (2006.01)

(56) References Cited

U.S. PATENT DOCUMENTS

2015/0357429 A1* 12/2015 Dubourdieu ........ H01L 29/4966
 257/295
2016/0111272 A1* 4/2016 Girard ................. H01L 21/0228
 438/770

* cited by examiner

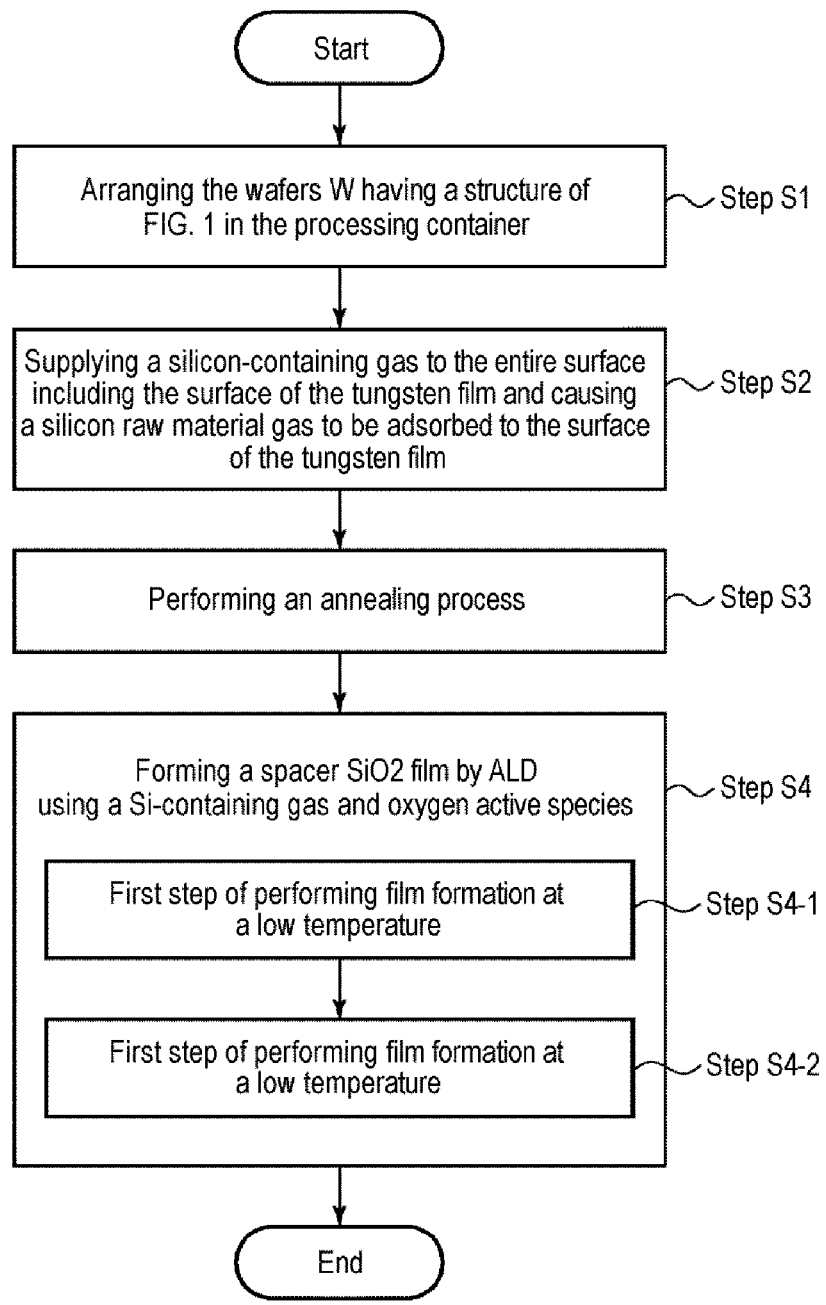

Initial

Si raw material gas adsorption

Annealing
$SiO_2$ film formation
($WO_3$ reduction)

First ALD-SiO$_2$ film formation

Second ALD-SiO$_2$ film formation

Transcription of US 10,636,649 B2

METHOD AND APPARATUS FOR FORMING SILICON OXIDE FILM ON TUNGSTEN FILM

CROSS-REFERENCE TO RELATED APPLICATION

This application is based upon and claims the benefit of priority from Japanese Patent Application No. 2017-149959, filed on Aug. 2, 2017, the entire contents of which are incorporated herein by reference.

TECHNICAL FIELD

The present disclosure relates to a method and apparatus for forming a silicon oxide film on a tungsten film.

BACKGROUND

For example, in the process of manufacturing a 3D-NAND type nonvolatile semiconductor device, a process is performed that includes stacking a silicon oxide film ($SiO_2$ film) and a silicon nitride film (SiN film) in multiple layers, forming a slit vertically in a stacking direction, wet-etching the SiN film via the slit to remove the SiN film, burying a tungsten film to be a gate electrode in a space formed after removing the SiN film, and then forming an $SiO_2$ film (spacer $SiO_2$ film) as a spacer insulating film of the tungsten film inside the vertical slit.

The process of forming the spacer $SiO_2$ film is performed by ALD using oxygen active species, for example, plasma ALD. In order to prevent deterioration of electric characteristics or reduction of productivity due to the oxidation of tungsten and the volatilization of tungsten, a method has been used in which an ALD process at a low temperature is executed as a first process and then a ALD process at a high temperature is executed as a second process to improve a wet etching resistance.

The above first process is executed at a low temperature. Thus, it is unlikely that the tungsten film is directly oxidized or volatilized. However, oxygen active species such as oxygen radicals or the like infiltrate into the tungsten film. At that time, a natural oxide film (tungsten oxide) on the surface of the tungsten film also infiltrates into the tungsten film, thereby causing oxidation of the tungsten film.

SUMMARY

Some embodiments of the present disclosure provide a technique of limiting oxidation of a tungsten film when a silicon oxide film is formed on the tungsten film by using oxygen active species such as oxygen radicals or the like.

According to one embodiment of the present disclosure, a method for forming a silicon oxide film on a tungsten film includes: performing a first process of arranging an object to be processed in a processing container kept under a reduced pressure, the object including a tungsten film and a natural oxide film being formed on a surface of the tungsten film, performing a second process of forming a silicon seed layer by adsorbing a silicon-containing gas to the tungsten film, subsequently performing a third process of annealing the object and forming the silicon oxide film by a reaction of the natural oxide film and the silicon seed layer and subsequently performing a fourth process of forming an ALD silicon oxide film by ALD using a silicon-containing gas and an oxygen active species.

According to another embodiment of the present disclosure, an apparatus for forming a silicon oxide film on a tungsten film includes: a processing container configured to accommodate an object to be processed, the object including a tungsten film and a natural oxide film being formed on a surface of the tungsten film, a gas supply part configured to supply a predetermined gas into the processing container, a heating mechanism configured to heat an inside of the processing container, an exhaust mechanism configured to exhaust the inside of the processing container such that the processing container is in a depressurized state and a control part configured to control the gas supply part, the heating mechanism, and the exhaust mechanism, wherein the control part controls at least one of the gas supply part, the heating mechanism, and the exhaust mechanism, to keep the inside of the processing container under a reduced pressure in a state in which the object is arranged inside the processing container, to form a silicon seed layer by supplying a silicon-containing gas into the processing container and absorbing the silicon-containing gas to the tungsten film, to subsequently anneal the object and form a silicon oxide film by a reaction of the natural oxide film and the silicon seed layer, and to supply a silicon-containing gas and oxygen active species alternately and form an ALD silicon oxide film by ALD.

According to another embodiment of the present disclosure, a non-transitory computer-readable storage medium operating on a computer and storing a program for controlling an apparatus for forming a silicon oxide film on a tungsten film, wherein the program, when executed, causes the computer to control the apparatus so that the method for forming a silicon oxide film on a tungsten film is performed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart showing a method for forming a silicon oxide film on a tungsten film according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be described below with reference to the accompanying drawings.
<One Example of a Structure to which an Embodiment of the Present Disclosure is Applied>

Figure 1:
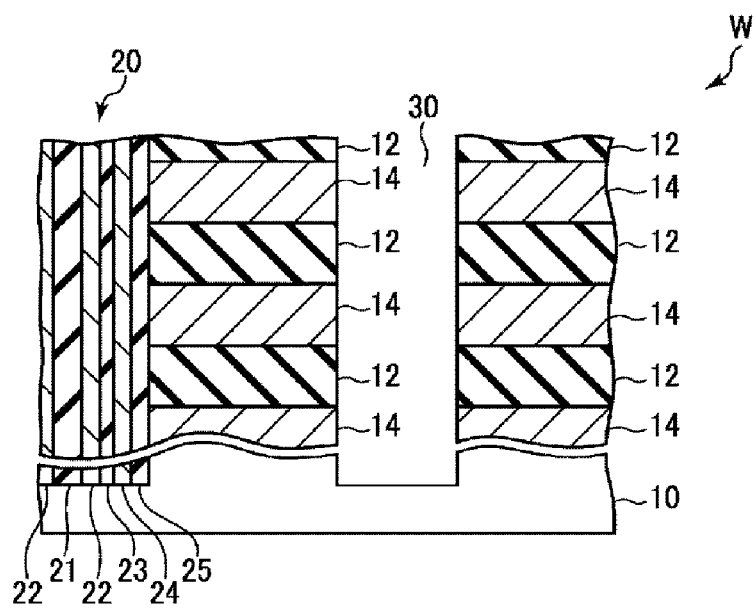
FIG. 1 is a view showing a wafer as an object to be processed, which forms a 3D-NAND type nonvolatile semiconductor device.

First, description will be made on an example of a structure to which a method for forming a silicon oxide film on a tungsten film according to an embodiment of the present disclosure is applied. FIG. 1 is a sectional view showing a state after a tungsten film is formed in a manufacturing process of a 3D-NAND type nonvolatile semiconductor device to which a method for forming a silicon oxide film on a tungsten film according to an embodiment of the present disclosure is applied.

FIG. 1 is a view showing a semiconductor wafer (hereinafter simply referred to as a wafer) W as an object to be processed, which forms a 3D-NAND type nonvolatile semiconductor device. The wafer W shown in FIG. 1 has a structure in which after a stacked body of an $SiO_2$ film 12 as an insulating film and a SiN film (not shown) as a sacrificial film is formed on a semiconductor substrate 10, a memory hole penetrating to the semiconductor substrate 10 in a stacking direction is formed, a memory string 20 is buried in the memory hole, the SiN film as a sacrificial film is etched and removed through a slit 30 in the stacking direction, and then a tungsten film 14 serving as a gate electrode is formed in a space where the SiN film is etched and removed.

The memory string 20 includes a core insulating film 21, a channel body 22 provided outside the core insulating film 21 and made of polysilicon, a tunnel oxide film 23 provided outside the channel body 22, a charge accumulation layer 24 provided outside the tunnel oxide film 23, and a blocking oxide film ($SiO_2$ film) 25 provided outside the charge accumulation layer 24. In FIG. 1, only a part of the memory string 20 is shown.
<Method for Forming Silicon Oxide Film on Tungsten Film>

Next, a method for forming a silicon oxide film on a tungsten film according to an embodiment of the present disclosure will be described. Description will be made where a spacer $SiO_2$ film is formed inside the slit 30 in the wafer W having the state shown in FIG. 1.

FIG. 2 is a flowchart showing a method for forming a silicon oxide film on a tungsten film according to an embodiment of the present disclosure, and FIGS. 3A to 3D are process sectional views at that time. FIGS. 4A to 4E are views schematically showing the states of the respective steps.

Figure 4A:
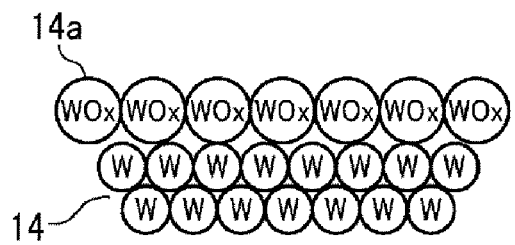
FIGS. 4A to 4E are views schematically showing the states of respective steps of a method for forming a silicon oxide film on a tungsten film according to an embodiment of the present disclosure.

First, a wafer W having the structure of FIG. 1 is arranged in a processing container (step S1). The interior of the processing container is brought into a reduced pressure state. At this time, as schematically shown in FIG. 4A, a tungsten oxide ($WO_x$ (typically $WO_3$)) film 14a, which is a natural oxide film, is formed on the surface of a tungsten film 14.

Figure 3A:
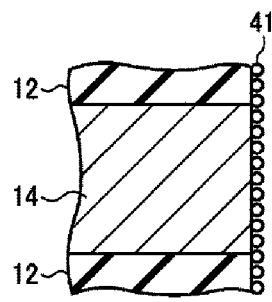
FIGS. 3A to 3D are process sectional views showing a method for forming a silicon oxide film on a tungsten film according to an embodiment of the present disclosure.
Figure 4B:
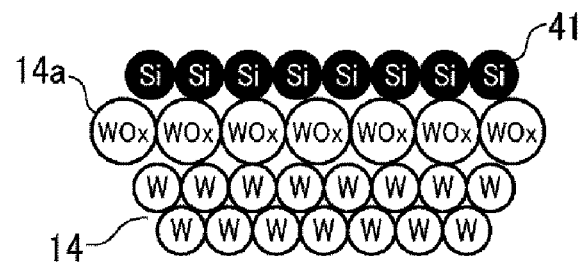

Next, a silicon-containing gas is supplied to the entire surface including the surface of the tungsten film 14 and the silicon-containing gas is adsorbed to the surface of the tungsten film 14 (step S2). Thus, as shown in FIG. 3A, a Si seed layer 41 is formed on the surface of the tungsten film 14. At this time, as schematically shown in FIG. 4B, the Si seed layer 41 is formed on the $WO_3$ film 14a which is a natural oxide film.

As the silicon-containing gas for forming the seed layer, a disilane ($Si_2H_6$) gas or an aminosilane gas adsorbed at a relatively low temperature is suitable. Examples of the aminosilane include butylaminosilane (BAS), bistertiarybutylaminosilane (BTBAS), dimethylaminosilane (DMAS), bisdimethylaminosilane (BDMAS), trisdimethylaminosilane (TDMAS), diethylaminosilane (DEAS), bisdiethylaminosilane (BDEAS), dipropylaminosilane (DPAS), diisopropylaminosilane (DIPAS), and the like. Among them, TDMAS and DIPAS (trade name: LTO520) are suitable.

The temperature at which this step is carried out is preferably in a range of 200 to 350 degrees C., and the pressure is preferably in a range of 1 to 10 Torr (133 to 1333 Pa). The flow rate of the silicon-containing gas at this time is preferably 100 to 2000 sccm, and the time of this step is preferably in a range of 1 to 30 min. Under these conditions, a Si seed layer 41 having a film thickness of 0.1 nm or less, preferably about 1 atomic layer is formed.

Figure 3B:
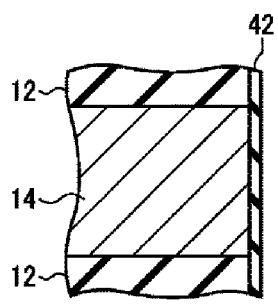
Figure 4C:
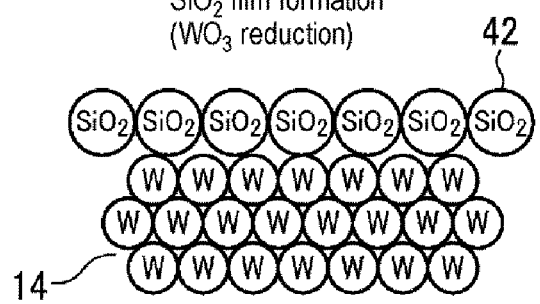

Next, an annealing process is performed (step S3). Thus, as shown in FIG. 3B, a $SiO_2$ film 42 is formed on the tungsten film 14. Specifically, as schematically shown in FIG. 4C, a $SiO_2$ film 42 serving as a barrier film is formed by a reaction of the $WO_3$ film 14a on the surface of the tungsten film 14 and the Si seed layer 41, and the $WO_3$ film 14a is reduced to become a part of the tungsten film 14. As a result, all or most of the $WO_3$ film 14a disappears. The reaction at this time occurs as represented by the following equation 1.

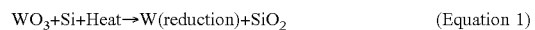

$$WO_3+Si+Heat\rightarrow W(reduction)+SiO_2 \qquad \text{(Equation 1)}$$

The annealing process is preferably performed in an atmosphere of an inert gas such as an $N_2$ gas or an Ar gas at a temperature range of 600 to 700 degrees C. The pressure at this time is preferably in a range of 1 to 10 Torr (133 to 1333 Pa). The time of this step is preferably in a range of 10 to 60 min.

Figure 5A:
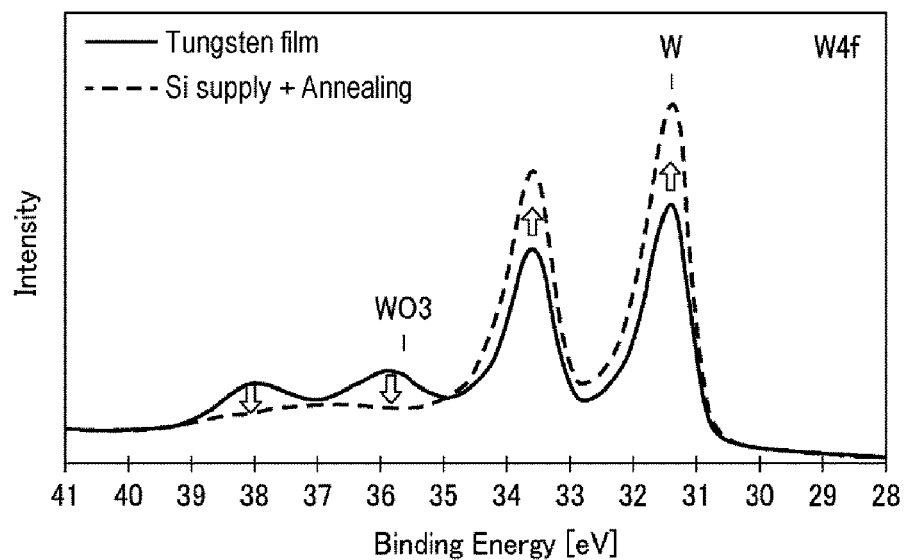
FIGS. 5A and 5B are views showing XPS spectra before and after performing Si-containing gas adsorption and annealing on a tungsten film.
Figure 5B:
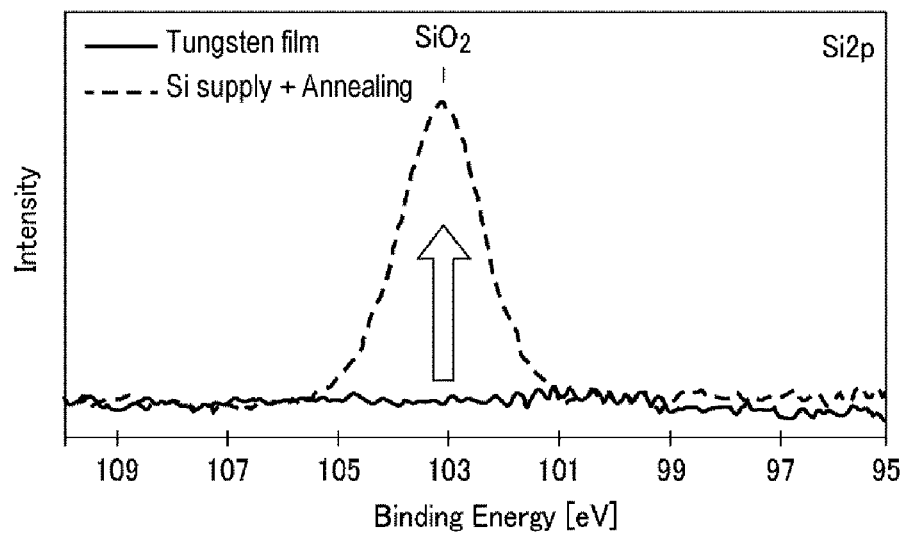

Actually, analysis by XPS was performed before and after performing the Si-containing gas adsorption and annealing on the tungsten film. FIGS. 5 A and 5B are diagrams showing the XPS spectra. FIG. 5A shows the peaks of $WO_3$ and W, and FIG. 5B shows the peak of $SiO_2$. Before performing the Si-containing gas adsorption and annealing (in a state in which the tungsten film is formed), the peak of $WO_3$ is present. However, it was confirmed that when the Si-containing gas adsorption and annealing is performed, the peak of $WO_3$ disappears and a peak of $SiO_2$ newly appears. From this, it was confirmed that due to the Si-containing gas adsorption and annealing, the $WO_3$ film as a natural oxide film is actually reduced to form a $SiO_2$ film.

Next, a spacer $SiO_2$ film (ALD-$SiO_2$ film) 43 is formed on the $SiO_2$ film 42 by ALD using an Si-containing gas and oxygen active species (step S4). This step is performed by alternately repeating the supply of the Si-containing gas into the processing container and the supply of the oxygen active species as an oxidizing agent into the processing container with the purging of the interior of the processing container by an inert gas interposed therebetween. As the Si-containing gas, it may be possible to use a silane-based gas containing chlorine such as a hexachlorodisilane (HCD) gas, a dichlorosilane (DCS) gas or the like, and an aminosilane-based gas such as a DIPAS gas, a TDMAS gas or the like. As the oxygen active species, it may be possible to use oxygen radicals, which is generated by oxygen-containing plasma or low-pressure radical oxidation (LPRO), or an ozone gas.

Figure 3C:
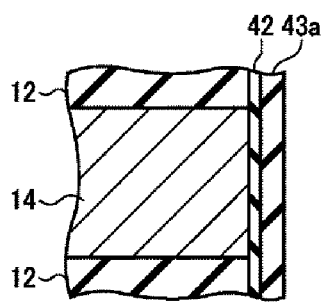
Figure 3D:
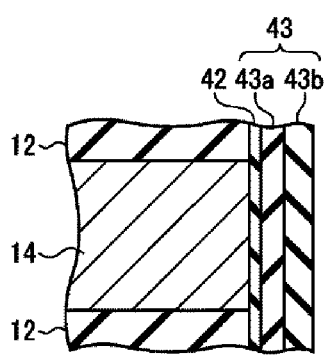
Figure 4D:
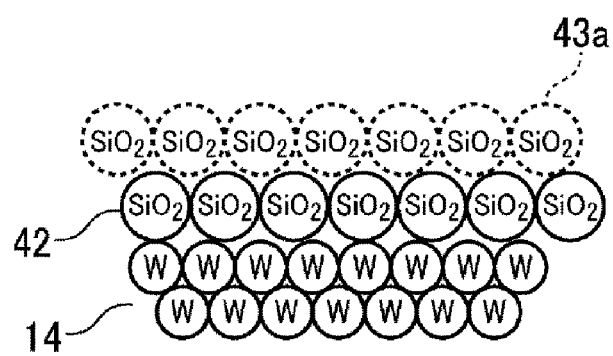
Figure 4E:
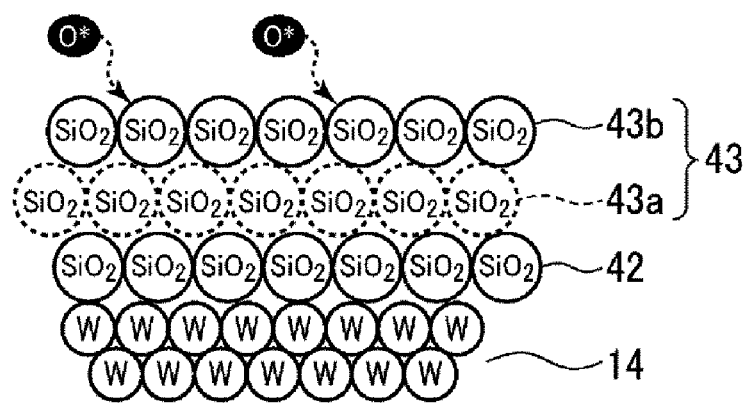

This step S4 is carried out in two steps including a first step (step S4-1) of forming a film at a low temperature and a second step (step S4-2) of forming a film at an intermediate-to-high temperature. That is, in the first step S4-1, a first ALD-$SiO_2$ film 43a having a high barrier property is formed by low-temperature film formation at 25 to 350 degrees C. as shown in FIG. 3C. In the second step S4-2, a second ALD-$SiO_2$ film 43b having a high quality and a high wet etching resistance is formed by an intermediate-to-high temperature film formation at 500 to 750 degrees C. as shown in FIG. 3D. The states of step S4-1 and step S4-2 are schematically shown in FIGS. 4D and 4E.

Step S4 may be performed by the following two methods of case 1 and case 2. Case 1 is a method using plasma, and case 2 is a method not using plasma.

1. Case 1
(a) First Step (Step S4-1)
Plasma ALD
Si-containing gas: aminosilane (preferably DIPAS (trade name: LTO520))
Oxidizing agent: oxygen-containing plasma (preferably $O_2$ gas plasma)
Temperature: around room temperature (25 to 35 degrees C.)
Pressure: 1 to 10 Torr (133 to 1333 Pa)
Si-containing gas supply time: 1 to 10 min
Oxidizing agent supply time: 1 to 20 min
Number of repetitions: 5 to 20 times
Film thickness: 1 to 10 nm
(b) Second Step (Step S4-2)
ALD using low-pressure radical oxidation (LPRO)
Si-containing gas: chlorine-containing Si compound gas (preferably hexachlorodisilane (HCD) gas)
Oxidizing agent: $O_2$ gas+$H_2$ gas ($O_2$ gas flow rate/($O_2$ gas flow rate+$H_2$ gas flow rate)=50 to 90%)
Temperature: 700 to 750 degrees C.
Pressure: 1 to 10 Torr (133 to 1333 Pa)
Si raw material supply time: 1 to 10 min
Oxidizing agent supply time: 1 to 10 min
Number of repetitions: 5 to 100 times
Film thickness: 1 to 100 nm 2. Case 2
(a) First Step (Step S4-1)
Thermal ALD
Si-containing gas: aminosilane (preferably DIPAS (trade name: LTO520))
Oxidizing agent: $O_3$ gas
Temperature: 300 to 350 degrees C.
Pressure: 1 to 10 Torr (133 to 1333 Pa)
Si raw material supply time: 1 to 10 min
Oxidizing agent supply time: 1 to 20 min
Number of repetitions: 5 to 20 times
Film thickness: 1 to 10 nm
(b) Second Step (Step S4-2)
Thermal ALD
Si-containing gas: aminosilane gas (preferably TDMAS)
Oxidizing agent: $O_3$ gas
Temperature: 500 to 550 degrees C.
Pressure: 1 to 10 Torr (133 to 1333 Pa)
Si raw material supply time: 1 to 10 min
Oxidizing agent supply time: 1 to 10 min
Number of repetitions: 5 to 100 times
Film thickness: 1 to 50 nm By performing step S4 through either case 1 or case 2 in this way, a spacer $SiO_2$ film 43 is formed on the tungsten film 14.

Figure 6:
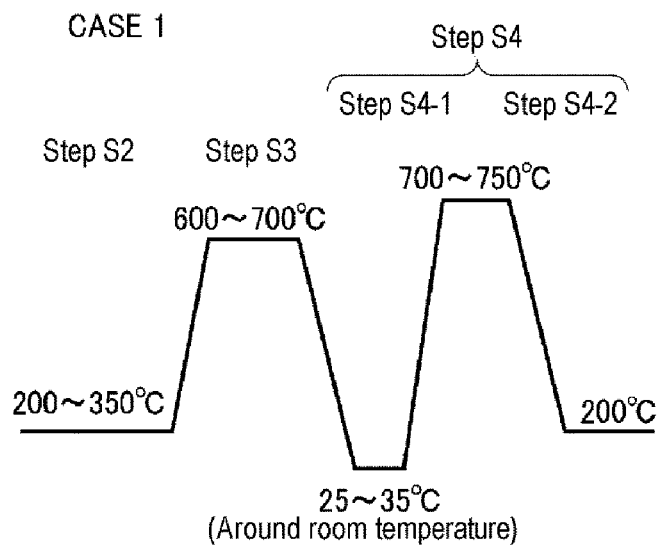
FIG. 6 is a diagram showing a temperature flowchart of steps S2 to S4 when step S4 is performed in case 1.
Figure 7:
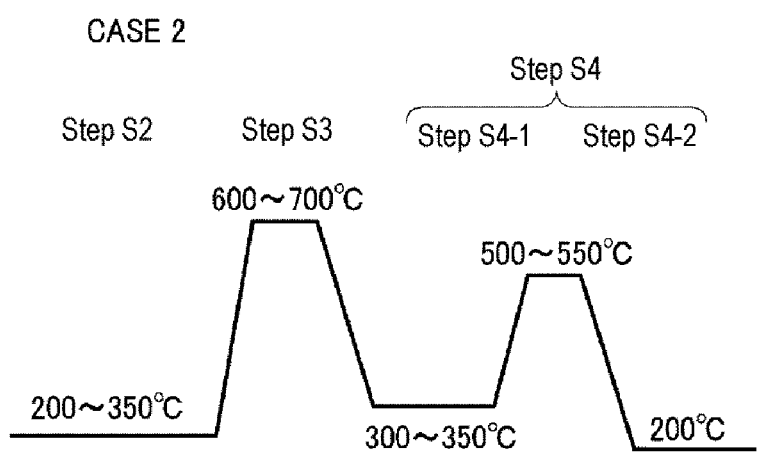
FIG. 7 is a diagram showing a temperature flowchart of steps S2 to S4 when step S4 is performed in case 2.

Although there are temperature changes in the above steps S2 to S4, it is preferable to carry out the above steps S2 to S4 in-situ. Temperature flow charts of steps S2 to S4 when step S4 is performed in case 1 and in case 2 are shown in FIGS. 6 and 7, respectively.

Figure 8A:
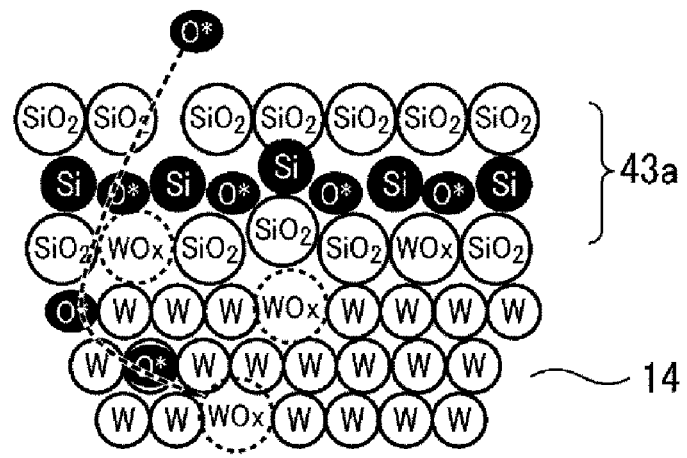
FIGS. 8A and 8B are views schematically showing a state in which a silicon oxide film is formed on a tungsten film by a conventional method.
Figure 8B:
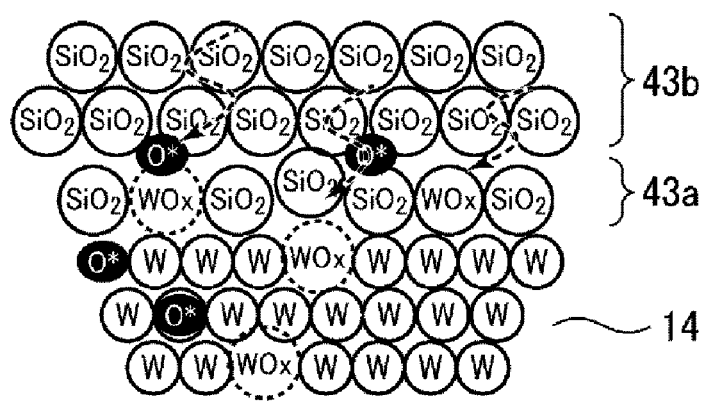

In the past, the spacer $SiO_2$ film is directly formed on the tungsten film 14 by ALD using oxygen active species. Thus, the state of FIG. 4A is changed as schematically shown in FIG. 8. That is, when the first ALD-$SiO_2$ film 43a is formed in the low-temperature ALD process which is a first step, oxygen active species such as oxygen radicals O* or the like infiltrate into the tungsten film 14. The $WO_3$ film 14a existing on the tungsten film 14 also infiltrates into the tungsten film 14. Thus, the oxidation of the tungsten film 14 proceeds (FIG. 8A). Then, in such a state, the second ALD-$SiO_2$ film 43b is formed in the ALD process at an intermediate-to-high temperature (FIG. 8B).

In contrast, according to an embodiment of the present disclosure, annealing is performed after forming the Si seed layer 41 on the surface of the tungsten film 14. Thus, the $SiO_2$ film 42 is formed by a reaction the oxygen of the $WO_3$ film 14a, which is a natural oxide film on the surface of the tungsten film 14, and the Si seed layer 41, and the $WO_3$ film 14a is reduced to become a part of the tungsten film 14. Therefore, when the spacer $SiO_2$ film 43 is formed thereon by using oxygen active species such as oxygen plasma or an $O_3$ gas, the $SiO_2$ film 42 becomes a barrier against oxygen active species such as oxygen plasma or the like. This makes it possible to limit the amount of the oxygen active species going into the tungsten film. Even if the oxygen active species infiltrate into the tungsten film, it is possible to suppress the oxidation of the tungsten film 14 as much as possible, because the $WO_3$ film 14a which is a natural oxide film has been removed. This makes it possible to suppress an increase in resistance due to the oxidation of the tungsten film.

In addition, the $WO_3$ film, which is easily volatilized, is removed and the $SiO_2$ film 42 is present on the tungsten film 14. Therefore, it is possible to suppress the volatilization of tungsten when subsequently forming the spacer $SiO_2$ film 43. This makes it possible to limit a decrease in productivity.

Furthermore, when forming the spacer $SiO_2$ film 43, the first ALD-$SiO_2$ film 43a having a high barrier property is first formed by low-temperature film formation. Thus, the first ALD-SiO$_2$ film 43a becomes a second barrier against oxygen active species such as oxygen radicals or the like and functions to assist the barrier property of the thin SiO$_2$ film 42 which is a first barrier. This makes it possible to more effectively prevent oxygen active species such as oxygen radicals O* or the like from infiltrating into the tungsten film 14.

In the case of using case 1 when forming the spacer SiO$_2$ film 43 in step S4, the apparatus to be used needs to include a plasma generation mechanism and therefore becomes complicated. However, the second ALD-SiO$_2$ film 43b can be formed at a high temperature of 700 to 750 degrees C. Therefore, the second ALD-SiO$_2$ film 43b becomes a high quality film. This makes it possible to increase the wet etching resistance of the spacer SiO$_2$ film 43.

On the other hand, in the case of using case 2 when forming the spacer SiO$_2$ film 43 in step S4, the temperature at the time of forming the second ALD-SiO$_2$ film 43b is 500 to 550 degrees C. which is lower than in case 1. Therefore, the wet etching resistance is somewhat inferior to that of case 1. However, there is no need to use plasma, which provides an advantage that the configuration of the apparatus is simple.

<Film Forming Apparatus>

Next, a processing apparatus for implementing the silicon oxide film forming method according to the above embodiment will be described.

First Example of Processing Apparatus

Figure 9:
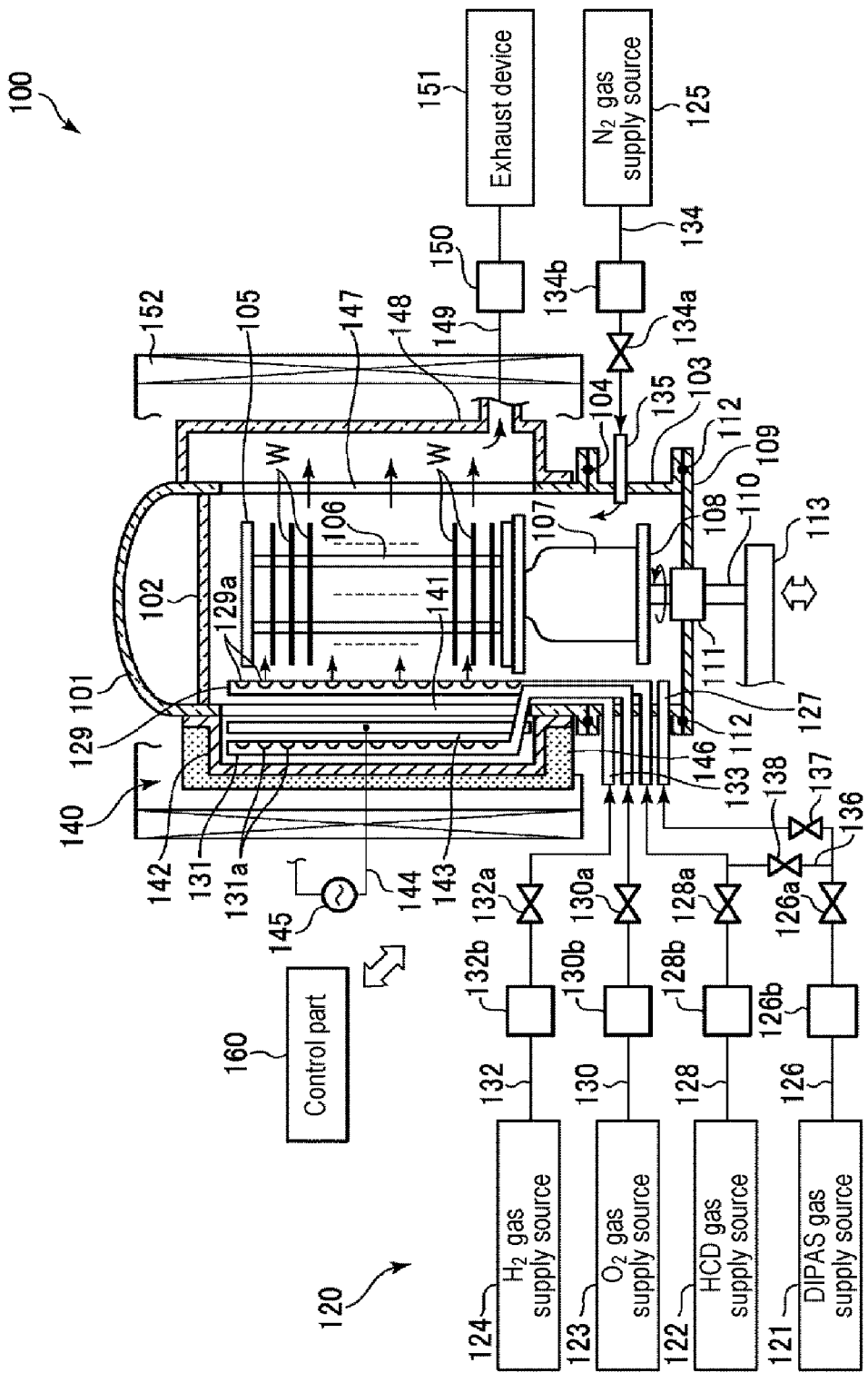
FIG. 9 is a vertical sectional view showing a first example of a processing apparatus capable of performing a method for forming a silicon oxide film on a tungsten film according to an embodiment of the present disclosure.
Figure 10:
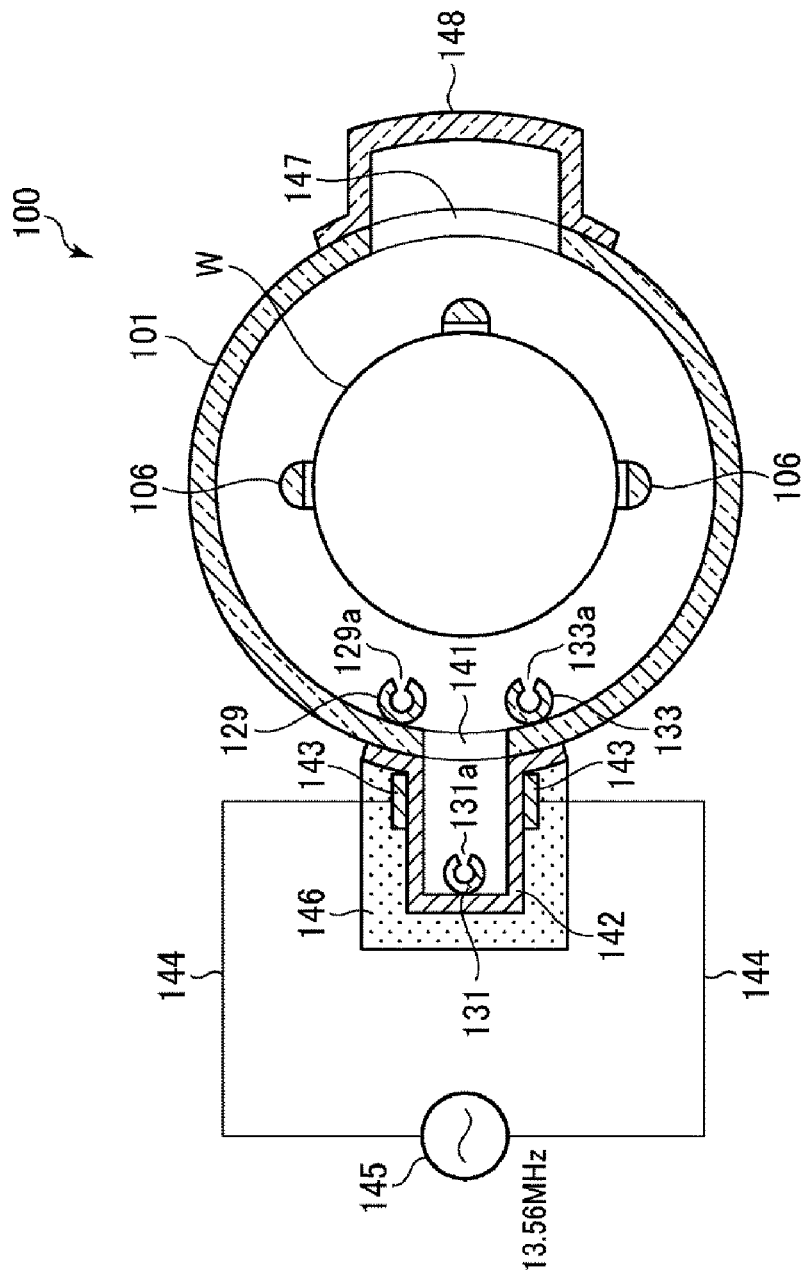
FIG. 10 is a horizontal sectional view showing a first example of a processing apparatus capable of performing a method for forming a silicon oxide film on a tungsten film according to an embodiment of the present disclosure.

First, description will be made on a first example of a processing apparatus capable of performing step S4 by the above case 1. FIG. 9 is a vertical sectional view showing a first example of a processing apparatus, and FIG. 10 is a horizontal sectional view thereof.

The processing apparatus 100 of this example includes a cylindrical processing container 101 having a ceiling with its lower end opened. The entire processing container 101 is made of, for example, quartz. A ceiling plate 102 made of quartz is provided and sealed at the ceiling portion in the processing container 101. As will be described later, the processing container 101 is configured to be heated by a heating device, and is configured as a film forming apparatus of a hot wall type. A manifold 103 formed into a cylindrical shape by, for example, stainless steel is connected to a lower end opening portion of the processing container 101 via a seal member 104 such as an O ring or the like.

The manifold 103 supports the lower end of the processing container 101. A quartz-made wafer boat 105 having 50 to 150 wafers W placed thereon in multiple stages can be inserted into the processing container 101 from the lower side of the manifold 103. The wafer boat 105 includes three support posts 106 (see FIG. 10). A large number of wafers W are supported by grooves formed in the support posts 106.

The wafer boat 105 is placed on a table 108 via a quartz-made heat-insulating cylinder 107. The table 108 is supported on a rotation shaft 110 penetrating a lid 109, which is made of, for example, stainless steel and configured to open and close a lower end opening portion of the manifold 103.

For example, a magnetic fluid seal 111 is provided at the portion which the rotation shaft 110 penetrates. The magnetic fluid seal 111 rotatably supports the rotation shaft 110 while hermetically sealing the rotation shaft 110. A seal member 112 made of, for example, an O ring is interposed between the peripheral portion of the lid 109 and the lower end portion of the manifold 103, thereby maintaining the sealing property of the interior of the processing container 101.

The rotation shaft 110 is attached to the tip end of an arm 113 supported by an elevating mechanism (not shown) such as, for example, a boat elevator or the like. The wafer boat 105, the lid 109 and the like are raised and lowered together so that the wafer boat 105 can be inserted into the processing container 101. The table 108 may be fixedly provided on the lid 109, and the wafer W may be processed without rotating the wafer boat 105.

The processing apparatus 100 includes a gas supply mechanism 120 for supplying various gases. The gas supply mechanism 120 includes a DIPAS gas supply source 121 for supplying a DIPAS gas, an HCD gas supply source 122 for supplying an HCD gas, an O$_2$ gas supply source 123 for supplying an O$_2$ gas, an H$_2$ gas supply source 124 for supplying an H$_2$ gas, and an N$_2$ gas supply source 125 for supplying an N$_2$ gas which is an inert gas.

A pipe 126 is connected to the DIPAS gas supply source 121, and a gas nozzle 127, which is made of quartz, has a linear shape, penetrates the side wall of the manifold 103 and extends inside of the processing container 101, is connected to the pipe 126. A pipe 128 is connected to the HCD gas supply source 122, and a gas dispersion nozzle 129, which is made of a quartz, penetrates the side wall of the manifold 103 and is vertically extended after being bent upward, is connected to the pipe 128. A pipe 130 is connected to the O$_2$ gas supply source 123, and a gas dispersion nozzle 131, which is made of a quartz, penetrates the side wall of the manifold 103 and is vertically extended after being bent upward, is connected to the pipe 130. A pipe 132 is connected to the H$_2$ gas supply source 124, and a gas dispersion nozzle 133, which is made of a quartz, penetrates the side wall of the manifold 103 and is vertically extended after being bent upward, is connected to the pipe 132. A pipe 134 is connected to the N$_2$ gas supply source 125, and a gas nozzle 135, which is made of a quartz, has a linear shape, penetrates the side wall of the manifold 103 and extends inside of the processing container 101, is connected to the pipe 134.

An opening/closing valve 126a and a flow rate controller 126b such as a mass flow controller or the like installed on the upstream side thereof are provided in the pipe 126. Similarly, opening/closing valves 128a, 130a, 132a and 134a and flow rate controllers 128b, 130b, 132b and 134b are provided in the pipes 128, 130, 132 and 134, respectively.

A branch pipe 136 is branched from a downstream portion of the opening/closing valve 126a of the pipe 126. The other end of the branch pipe 136 is connected to the downstream side of the opening/closing valve 128a of the pipe 128. An opening/closing valve 137 is provided on the downstream side of the branch portion of the branch pipe 136 in the pipe 126, and an opening/closing valve 138 is provided in the branch pipe 136.

Thus, a DIPAS gas as a Si raw material may be supplied from the DIPAS gas supply source 121 into the processing container 101 via the pipe 126 and the gas nozzle 127 in a state in which the opening/closing valves 126a and 137 are opened and the opening/closing valve 138 is closed. In addition, the DIPAS gas may be supplied into the processing container 101 via the pipe 126, the branch pipe 136, the pipe 128 and the gas dispersion nozzle 129 in a state in which the opening/closing valves 126a and 138 are opened and the opening/closing valves 128a and 137 are closed.

A plurality of gas discharge holes 129a, 131a and 133a (holes 133a are shown only in FIG. 10) are formed in the vertical portions of the gas dispersion nozzles 129, 131 and 133 at predetermined intervals in correspondence to the respective wafers W over the vertical length corresponding to the wafer support range of the wafer boat 105. Thus, it is possible to discharge gases substantially uniformly from the gas discharge holes 129a, 131a and 133a toward the processing container 101 in the horizontal direction.

A plasma generating mechanism 140 is formed on a part of the side wall of the processing container 101. The plasma generation mechanism 140 is used for generating $O_2$ plasma and supplying oxygen radicals O* into the processing container 101.

The plasma generation mechanism 140 includes a plasma partition wall 142 airtightly welded to the outer wall of the processing container 101. The plasma partition wall 142 is made of, for example, quartz. The plasma partition wall 142 has a concave cross-sectional shape and covers an opening 141 formed in the side wall of the processing container 101. The opening 141 is elongated in the vertical direction so as to vertically cover all the wafers W supported by the wafer boat 105. The dispersion nozzle 131 for discharging the $O_2$ gas is disposed in the inner space defined by the plasma partition wall 142, i.e., the plasma generation space. The gas dispersion nozzles 129 and 133 are respectively provided at positions sandwiching the opening 141 in the inner wall of the processing container 101.

In addition, the plasma generation mechanism 140 further includes a pair of elongated plasma electrodes 143 arranged on the outer surfaces of both side walls of the plasma partition wall 142 along the vertical direction so as to face each other, and a high-frequency power supply 145 connected to the respective plasma electrodes 143 via power supply lines 144 and configured to supply high frequency power to the plasma electrodes 143. The high-frequency power supply 145 applies a high-frequency voltage of, for example, 13.56 MHz to the plasma electrodes 143. As a result, a high-frequency electric field is applied to the plasma generation space defined by the plasma partition wall 142. The $O_2$ gas discharged from the gas discharge holes 131a of the dispersion nozzle 131 is converted into plasma (excited) in the plasma generation space to which the high-frequency electric field is applied. Oxygen radicals (O*) in the plasma are mainly supplied into the processing container 101 through the opening 141.

An insulating protection cover 146 is attached to the outside of the plasma partition wall 142 so as to cover the plasma partition wall 142. A coolant passage (not shown) is provided in the inner portion of the insulating protection cover 146. The plasma electrode 143 is cooled by allowing a coolant to flow through the coolant passage.

An exhaust port 147 for evacuating the inside of the processing container 101 is provided on the side wall portion of the processing container 101 facing the opening 141. The exhaust port 147 is elongated vertically so as to correspond to the wafer boat 105. An exhaust port cover member 148 formed in a U-shaped cross section (see FIG. 10) so as to cover the exhaust port 147 is attached to the portion of the processing container 101 corresponding to the exhaust port 147. The exhaust port cover member 148 extends upward along the side wall of the processing container 101. An exhaust pipe 149 for evacuating the processing container 101 via the exhaust port 147 is connected to the lower portion of the exhaust port cover member 148. A pressure control valve 150 for controlling the pressure inside the processing container 101 and an exhaust device 151 including a vacuum pump or the like are connected to the exhaust pipe 149. The inside of the processing container 101 is exhausted by the exhaust device 151 through the exhaust pipe 149.

A cylindrical heating mechanism (heater) 152 is provided outside the processing container 101 so as to surround the outer periphery of the processing container 101. By supplying electric power to the heating mechanism 152, the processing container 101 and the wafers W inside the processing container 101 are heated to a predetermined temperature.

The processing apparatus 100 includes a control part 160. The control part 160 controls the respective components of the processing apparatus 100, for example, the valves, the mass flow controllers as flow rate controllers, the drive mechanisms such as the elevating mechanism, the heating mechanism 152, and the like. The control part 160 includes a main control part having a CPU, an input device, an output device, a display device and a memory device. A storage medium storing programs for controlling the process executed by the processing apparatus 100, i.e., processing recipes is set in the memory device. The main control part reads a predetermined processing recipe stored in the storage medium and performs control so that the processing apparatus 100 is caused to perform a predetermined process based on the processing recipe.

Next, a method for forming a silicon oxide film using the processing apparatus of the first example will be described.

The film formation is performed as follows based on the process recipe stored in the storage medium in the control part 160.

First, a plurality of, for example, 50 to 150, wafers W having the structure shown in FIG. 1 are mounted on the wafer boat 105 in an air atmosphere, and the wafer boat 105 is inserted into the processing container 101 of the processing apparatus 100 from below, whereby the wafers W are accommodated in the processing container 101. Then, by closing the lower end opening portion of the manifold 103 with the lid 109, the space inside the processing container 101 is sealed.

While evacuating the interior of the processing container 101 by the exhaust device 151, an $N_2$ gas as an inert gas is supplied from the $N_2$ gas supply source 125 into the processing container 101 to create an $N_2$ gas atmosphere in a predetermined depressurized state. The temperature of the wafers W is increased by the heating mechanism 152 to a predetermined temperature in the range of 200 to 350 degrees C.

When the temperature of the wafers W reaches the predetermined temperature, a DIPAS gas is supplied from the DIPAS gas supply source 121 into the processing container 101 through the pipe 126 and the gas nozzle 127. The DIPAS gas is adsorbed to the surface of the wafer W (the surface of the tungsten film) to form a Si seed layer.

Next, the supply of the DIPAS gas is stopped. An $N_2$ gas is supplied into the processing container 101 from the $N_2$ gas supply source 125 to purge the DIPAS gas. While keeping the inside of the processing container in an $N_2$ gas atmosphere, the wafers W are heated to 600 to 700 degrees C. by the heating mechanism 152. The Si seed layer and the natural oxide film ($WO_3$ film) present on the surface of the tungsten film are reacted, then the $WO_3$ film is reduced and an $SiO_2$ film serving as a barrier layer is formed on the surface.

Next, while the supply of the $N_2$ gas is continued, the temperature of the wafers W is lowered to a normal temperature (room temperature), and the DIPAS gas is supplied from the DIPAS gas supply source 121 into the processing container 101 along the surfaces of the wafers W via the pipe 126, the branch pipe 136, the pipe 128 and the gas dispersion nozzle 129 so that the DIPAS gas is adsorbed to the surfaces of the wafers W. Then, the supply of the DIPAS gas is stopped, and the interior of the processing container 101 is purged with the $N_2$ gas. Thereafter, high frequency power is supplied from the high-frequency power supply 145 to the plasma electrodes to form plasma in the plasma generation space. Oxygen radicals (O*) in the plasma are mainly supplied from the $O_2$ gas supply source 123 via the pipe 130 and the gas dispersion nozzle 131 along the wafers W to oxidize the Si adsorbed to the wafers W. Then, the supply of the high frequency power and the $O_2$ gas is stopped and the interior of the processing container 101 is purged by the $N_2$ gas. These operations are repeated a predetermined number of times to form a first ALD-$SiO_2$ film having a high barrier property by low-temperature film formation.

Next, while the $N_2$ gas is being supplied into the processing container 101, the wafer temperature is raised to a predetermined temperature in the range of 700 to 750 degrees C. by the heating mechanism 152. An HCD gas is supplied from the HCD gas supply source 122 into the processing container 101 along the surfaces of the wafers W via the pipe 128 and the dispersion nozzle 129 and is adsorbed to the surfaces of the wafers W. Then, the supply of the HCD gas is stopped, and the interior of the processing container 101 is purged with the $N_2$ gas. Thereafter, an $O_2$ gas and an $H_2$ gas are supplied from the $O_2$ gas supply source 123 and the $H_2$ gas supply source 124 into the processing container via the pipe 130 and the gas dispersion nozzle 131 and via the pipe 132 and the gas dispersion nozzle 133, respectively, thereby subjecting the adsorbed Si to low-pressure radical oxidation (LPRO). Then, the supply of the $O_2$ gas and the $H_2$ gas is stopped, and the interior of the processing container 101 is purged with the $N_2$ gas. These operations are repeated a predetermined number of times to form a second ALD-$SiO_2$ film having a high etching resistance by high temperature film formation.

After completion of the above process, the interior of the processing container 101 is purged with the $N_2$ gas. Then, the pressure inside the processing container 101 is returned to atmospheric pressure, and the wafer boat 105 is unloaded downward.

According to the processing apparatus of this example, the above steps S1 to S4 can be performed in-situ. This makes it possible to increase productivity. In addition, since the film formation temperature of the second ALD-$SiO_2$ film is as high as 700 to 750 degrees C., it is possible to form an ALD-$SiO_2$ film having high quality and high wet etching resistance.

Second Example of Processing Apparatus

Figure 11:
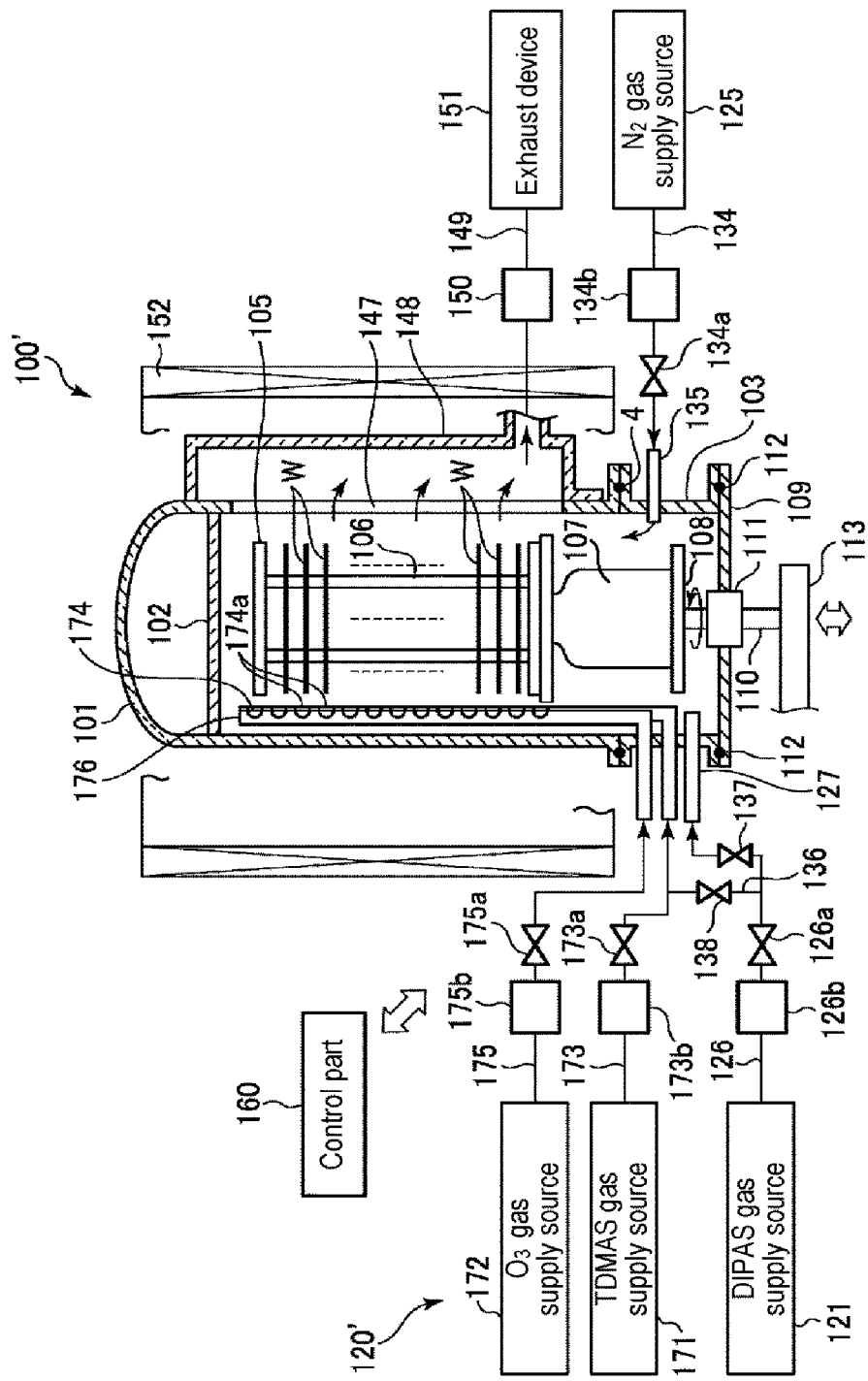
FIG. 11 is a vertical sectional view showing a second example of a processing apparatus capable of performing a method for forming a silicon oxide film on a tungsten film according to an embodiment of the present disclosure.
Figure 12:
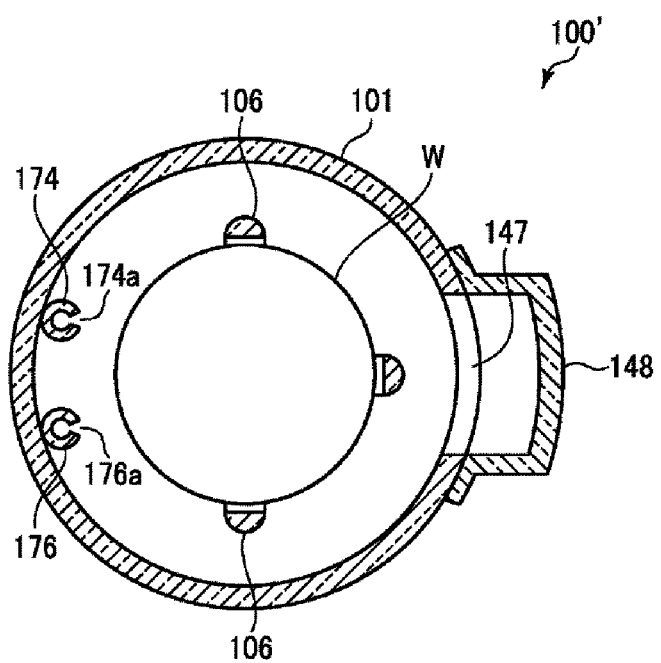
FIG. 12 is a horizontal sectional view showing a second example of a processing apparatus capable of performing a method for forming a silicon oxide film on a tungsten film according to an embodiment of the present disclosure.

Next, a second example of a processing apparatus capable of performing step S4 by the above case 2 will be described. FIG. 11 is a vertical sectional view showing a second example of a processing apparatus, and FIG. 12 is a horizontal sectional view thereof.

The processing apparatus 100' of this example is the same as the processing apparatus 100 of the first example except that it does not include a plasma generation mechanism and that it includes a gas supply mechanism 120' for supplying different gases other than the DIPAS gas and the $N_2$ gas. The same reference numerals are given to the same components as those of the processing apparatus 100, and description thereof will be omitted.

Similar to the gas supply mechanism 120, the gas supply mechanism 120' includes a DIPAS gas supply source 121 and an $N_2$ gas supply source 125. In addition, the gas supply mechanism 120' further includes a TDMAS gas supply source 171 and an $O_3$ gas supply source 172.

Similar to the first example, a pipe 126 is connected to the DIPAS gas supply source 121 as in the first example, and a gas nozzle 127, which is made of a quartz, has a linear shape, penetrates the side wall of the manifold 103 and extends inside of the processing container 101, is connected to the pipe 126. Similar to the first example, a pipe 134 is connected to the $N_2$ gas supply source 125, and a gas nozzle 135 which is made of a quartz, has a linear shape, penetrates the sidewall of the manifold 103 and extends inside of the processing container 101, is connected to the pipe 134. A pipe 173 is connected to the TDMAS gas supply source 171, and a gas dispersion nozzle 174, which is made of a quartz, penetrates the side wall of the manifold 103 and extends vertically after being bent upward is connected to the pipe 173. A pipe 175 is connected to the $O_3$ gas supply source 172, and a gas dispersion nozzle 176, which is made of a quartz, penetrates the side wall of the manifold 103 and extends vertically after being bent upward is connected to the pipe 175.

Similar to the first example, an opening/closing valve 126a and a flow rate controller 126b such as a mass flow controller or the like installed on the upstream side thereof are provided in the pipe 126. An opening/closing valve 134a and a flow rate controller 134b are also provided in the pipe 134. Opening/closing valves 173a and 175a and flow controllers 173b and 175b are provided in the pipes 173 and 175, respectively.

A branch pipe 136 branches off from the downstream side portion of the opening/closing valve 126a in the pipe 126. The other end of the branch pipe 136 is connected to the downstream side of the opening/closing valve 173a in the pipe 173. An opening/closing valve 137 is formed on the downstream side of the branch portion of the branch pipe 136 in the pipe 126, and an opening/closing valve 138 is provided in the branch pipe 136.

Thus, a DIPAS gas as a Si raw material may be supplied from the DIPAS gas supply source 121 into the processing container 101 via the pipe 126 and the gas nozzle 127 in a state in which the opening/closing valves 126a and 137 are opened and the opening/closing valve 138 is closed. In addition, the DIPAS gas may be supplied from the DIPAS gas supply source 121 into the processing container 101 via the pipe 126, the branch pipe 136, the pipe 173, and the gas dispersion nozzle 174 in a state in which the opening/closing valves 126a and 138 are opened and the opening/closing valves 173a and 137 are closed.

In the vertical portions of the gas dispersion nozzles 174 and 176, a plurality of gas discharge holes 174a and 176a corresponding to the respective wafers W is formed at predetermined intervals over the vertical length corresponding to the wafer support range of the wafer boat 105. Thus, it is possible to discharge gases substantially uniformly from the gas discharge holes 174a and 176a toward the processing container 101 in the horizontal direction.

Next, a method of forming a silicon oxide film using the processing apparatus of the second example will be described.

The film formation is performed as follows based on the process recipe stored in the storage medium in the control part 160.

First, a plurality of, for example, 50 to 150, wafers W having the structure shown in FIG. 1 are mounted on the wafer boat 105 in an air atmosphere, and the wafer boat 105 is inserted into the processing container 101 of the processing apparatus 100' from below, whereby the wafers W are accommodated in the processing container 101. Then, by closing the lower end opening portion of the manifold 103 with the lid 109, the space inside the processing container 101 is sealed.

While evacuating the interior of the processing container 101 by the exhaust device 151, an $N_2$ gas as an inert gas is supplied from the $N_2$ gas supply source 125 into the processing container 101 to create an $N_2$ gas atmosphere in a predetermined depressurized state. The temperature of the wafers W is increased by the heating mechanism 152 to a predetermined temperature in the range of 200 to 350 degrees C.

When the temperature of the wafers W reaches the predetermined temperature, a DIPAS gas is supplied from the DIPAS gas supply source 121 into the processing container 101 through the pipe 126 and the gas nozzle 127. The DIPAS gas is adsorbed to the surface of the wafer W (the surface of the tungsten film) to form a Si seed layer.

Next, the supply of the DIPAS gas is stopped. An $N_2$ gas is supplied into the processing container 101 from the $N_2$ gas supply source 125 to purge the DIPAS gas. While keeping the inside of the processing container in an $N_2$ gas atmosphere, the wafers W are heated to 600 to 700 degrees C. by the heating mechanism 152. The Si seed layer and the natural oxide film ($WO_3$ film) present on the surface of the tungsten film are reacted, and then the $WO_3$ film is reduced and an $SiO_2$ film serving as a barrier layer is formed on the surface.

Next, while the supply of the $N_2$ gas is continued, the temperature of the wafers W is lowered to a predetermined temperature in the range of 300 to 350 degrees C., and the DIPAS gas is supplied from the DIPAS gas supply source 121 into the processing container 101 along the surfaces of the wafers W via the pipe 126, the branch pipe 136, the pipe 173 and the gas discharge holes 174a of the gas dispersion nozzle 174 so that the DIPAS gas is adsorbed to the surfaces of the wafers W. Then, the supply of the DIPAS gas is stopped, and the interior of the processing container 101 is purged with $N_2$ gas. Thereafter, an $O_3$ gas is supplied along the wafers from the $O_3$ gas supply source 172 via the pipe 175 and the gas dispersion nozzle 176 to oxidize the Si adsorbed to the wafers W. Then, the supply of the $O_3$ gas is stopped, and the interior of the processing container 101 is purged with $N_2$ gas. These operations are repeated a predetermined number of times to form a first ALD-$SiO_2$ film having a high barrier property by low-temperature film formation.

Next, while the $N_2$ gas is being supplied into the processing container 101, the wafer temperature is raised to a predetermined temperature in the range of 500 to 550 degrees C. by the heating mechanism 152. A TDMAS gas is supplied from the TDMAS gas supply source 171 into the processing container 101 along the surfaces of the wafers W via the pipe 173 and the dispersion nozzle 174 and is adsorbed to the surfaces of the wafers W. Then, the supply of the TDMAS gas is stopped, and the interior of the processing container 101 is purged with the $N_2$ gas. Thereafter, an $O_3$ gas is supplied from the $O_3$ gas supply source 172 along the wafers via the pipe 175 and the gas dispersion nozzle 176, thereby oxidizing the Si adsorbed to the wafers, W. Then, the supply of the $O_3$ gas is stopped, and the interior of the processing container 101 is purged with the $N_2$ gas. These operations are repeated a predetermined number of times to form a second ALD-$SiO_2$ film having a high etching resistance by middle temperature film formation.

After completion of the above process, the interior of the processing container 101 is purged with the $N_2$ gas. Then, the pressure inside the processing container 101 is returned to the atmospheric pressure, and the wafer boat 105 is unloaded downward.

According to the processing apparatus of this example, the above steps S1 to S4 can be performed in-situ. This makes it possible to increase the productivity. In addition, since the plasma is not used, the apparatus configuration is simple.

<Other Applications>

Although the embodiment of the present disclosure has been described above, the present disclosure is not limited to the above-described embodiment. Various modifications may be made without departing from the spirit of the present disclosure.

For example, in the above-described embodiment, the present disclosure is applied to the case where the cap $SiO_2$ film is formed on the tungsten film when forming a 3D-NAND type nonvolatile semiconductor device. However, the present disclosure is not limited thereto. The present disclosure may be applied to a case where an ALD-$SiO_2$ film is formed on a tungsten film having a natural oxide film on the surface thereof by ALD using a silicon-containing gas and oxygen active species.

In the above embodiment, the two-layer structure of the first ALD-$SiO_2$ film formed at a low temperature and the second ALD-$SiO_2$ film formed at an intermediate-to-high temperature is shown as the ALD-$SiO_2$ film. However, the present disclosure is not limited thereto. The ALD-$SiO_2$ film may be a single layer.

Furthermore, the silicon-containing gas for forming the Si seed layer and the silicon-containing gas and the oxygen active species for forming the ALD-$SiO_2$ film in the above embodiment are merely examples and are not limited to those described in the embodiment. Furthermore, although an example in which a vertical batch type apparatus is applied as a processing apparatus has been described, the present disclosure is not limited thereto. It may also be possible to use a horizontal batch type apparatus, a single wafer type apparatus and a semi-batch type apparatus which performs processing by mounting a plurality of workpieces on a rotary table.

According to the present disclosure, a silicon seed layer is formed by adsorbing a silicon-containing gas to a tungsten film having a natural oxide film formed on a surface of the tungsten film. Thereafter, annealing is performed and a silicon oxide film is formed by a reaction between the natural oxide film and the silicon seed layer. Therefore, when subsequently forming an ALD silicon oxide film by ALD which makes use of a silicon-containing gas and oxygen active species, the silicon oxide film serves as a barrier of the oxygen active species. Furthermore, the natural oxide film is removed. It is therefore possible to effectively suppress oxidation of the tungsten film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a silicon oxide film on a tungsten film, comprising:
   performing a first process of arranging an object to be processed in a processing container kept under a reduced pressure, the object including a tungsten film and a natural oxide film being formed on a surface of the tungsten film;
   performing a second process of forming a silicon seed layer on the natural oxide film by adsorbing a silicon-containing gas to the surface of the tungsten film;
   subsequently performing a third process of reducing the natural oxide film to become a part of the tungsten film and oxidizing the silicon seed layer to form a silicon oxide film on the tungsten film by annealing the object; and
   subsequently performing a fourth process of forming an ALD silicon oxide film on the silicon oxide film formed in the third process by ALD using a silicon-containing gas and an oxygen active species.

2. The method of claim 1, wherein the silicon-containing gas used in the second process includes an aminosilane gas or a disilane gas.

3. The method of claim 2, wherein the silicon-containing gas used in the second process contains trisdimethylaminosilane or diisopropylaminosilane.

4. The method of claim 1, wherein the third process is performed in an inert gas atmosphere at a temperature in a range of 600 to 700 degrees C.

5. The method of claim 1, wherein in the fourth process, a silane-based gas containing chlorine or an aminosilane-based gas is used as the silicon-containing gas, and an oxygen radical or an ozone gas is used as the oxygen active species.

6. The method of claim 1, wherein the fourth process includes:
   a first step of forming a first ALD silicon oxide film by a film formation at a low temperature in a range of 25 to 350 degrees C.; and
   a second step of forming a second ALD silicon oxide film by a film formation at an intermediate-to-high temperature in a range of 500 to 750 degrees C.

7. The method of claim 6, wherein in the fourth process, the first step is performed at a temperature in a range of 25 to 35 degrees C. by using an aminosilane-based gas as the silicon-containing gas and using an oxygen radical, which is generated by oxygen plasma, as the oxygen active species, and the second step is performed at a temperature in a range of 700 to 750 degrees C. by using a silane-based gas containing chlorine as the silicon-containing gas and using a radical in low-pressure radical oxidation through the use of an oxygen gas and a hydrogen gas as the oxygen active species.

8. The method of claim 7, wherein the first step is performed by using a diisopropylaminosilane gas as the aminosilane-based gas, and the second step is performed by using a hexachlorodisilane gas as the silane-based gas containing chlorine.

9. The method of claim 6, wherein in the fourth process, the first step is performed at a temperature in a range of 300 to 350 degrees C. by using an aminosilane-based gas as the silicon-containing gas and using an ozone gas as the oxygen active species, and the second step is performed at a temperature in a range of 500 to 550 degrees C. by using an aminosilane-based gas as the silicon-containing gas and using an ozone gas as the oxygen active species.

10. The method of claim 9, wherein the first step is performed by using a diisopropylaminosilane gas as the aminosilane-based gas, and the second step is performed by using a trisdimethylaminosilane gas as the aminosilane-based gas.

11. The method of claim 1, wherein the object is a semiconductor wafer forming a 3D-NAND type nonvolatile semiconductor device.

* * * * *